United States Patent
Naruse

(10) Patent No.: US 12,205,935 B2
(45) Date of Patent: Jan. 21, 2025

(54) SEMICONDUCTOR DEVICE

(71) Applicant: AISIN CORPORATION, Aichi (JP)

(72) Inventor: Takanobu Naruse, Kariya (JP)

(73) Assignee: AISIN CORPORATION, Aichi (JP)

( * ) Notice: Subject to any disclaimer, the term of this patent is extended or adjusted under 35 U.S.C. 154(b) by 805 days.

(21) Appl. No.: 17/298,164

(22) PCT Filed: Sep. 12, 2019

(86) PCT No.: PCT/JP2019/035863
§ 371 (c)(1),
(2) Date: May 28, 2021

(87) PCT Pub. No.: WO2020/179109
PCT Pub. Date: Sep. 10, 2020

(65) Prior Publication Data
US 2022/0122954 A1    Apr. 21, 2022

(30) Foreign Application Priority Data

Mar. 4, 2019  (JP) .................. 2019-038618

(51) Int. Cl.
 *H01L 25/16* (2023.01)
 *H01L 23/12* (2006.01)
 (Continued)

(52) U.S. Cl.
 CPC .............. *H01L 25/16* (2013.01); *H01L 23/12* (2013.01); *H01L 23/49838* (2013.01);
 (Continued)

(58) Field of Classification Search
 CPC .......... G11C 5/04; G11C 5/25; H01L 23/4983
 See application file for complete search history.

(56) References Cited

U.S. PATENT DOCUMENTS 7,773,491 B2   8/2010  Nakatani
2005/0141395 A1  6/2005  Nakatani
(Continued)

FOREIGN PATENT DOCUMENTS

CN     105786144 A    7/2016
JP      8-339242 A   12/1996
(Continued)

OTHER PUBLICATIONS

Extended European Search Report dated Mar. 24, 2022, issued in European Application No. 19917847.6.
(Continued)

*Primary Examiner* — Mounir S Amer
(74) *Attorney, Agent, or Firm* — Sughrue Mion, PLLC

(57) ABSTRACT

The present invention supplies electric power to a semiconductor module appropriately and also curbs the number of wiring layers of a main substrate on which the semiconductor module is mounted. A semiconductor device (10) is provided with a main substrate (90) and a semiconductor module (1). A first power supply circuit (71), the semiconductor module (1), and a first element (9) are mounted on the main substrate (90). The semiconductor module (1) is provided with a second element (2, 3) and a module substrate (4) on which the second element (2, 3) is mounted. The first power supply circuit (71) supplies electric power (Vcc) to the first element (9). The semiconductor module (1) is further provided with a second power supply circuit (72) mounted on the module substrate (4), and the second power supply circuit (72) supplies electric power (Vcc) to the second element (2, 3).

4 Claims, 8 Drawing Sheets

(51) Int. Cl.
  *H01L 23/498* (2006.01)
  *H01L 23/50* (2006.01)
  *H01L 25/065* (2023.01)
  *H05K 1/02* (2006.01)
  *H05K 1/18* (2006.01)

(52) U.S. Cl.
  CPC .......... *H01L 23/50* (2013.01); *H01L 25/0655* (2013.01); *H05K 1/0218* (2013.01); *H05K 1/182* (2013.01)

(56) References Cited

U.S. PATENT DOCUMENTS

| | | | |
|---|---|---|---|
| 2005/0169033 A1 | 8/2005 | Sugita et al. | |
| 2016/0327976 A1* | 11/2016 | Lym | G11C 5/141 |
| 2018/0197801 A1 | 7/2018 | Naruse | |
| 2018/0204827 A1* | 7/2018 | Betsui | H01L 24/16 |

FOREIGN PATENT DOCUMENTS

| | | |
|---|---|---|
| JP | 11-186771 A | 7/1999 |
| JP | 2002-543513 A | 12/2002 |
| JP | 2005-183872 A | 7/2005 |
| JP | 2006-049376 A | 2/2006 |
| JP | 2007-165928 A | 6/2007 |
| WO | 2017/038905 A1 | 3/2017 |

OTHER PUBLICATIONS

Lee, Kangwook, "High-Density Fan-Out Technology for Advanced SiP and 3D Heterogeneous Integration," IEEE, 2018 IRPS (4 pages).

International Search Report for PCT/JP2019/035863 dated Dec. 3, 2019 [PCT/ISA/210].

* cited by examiner

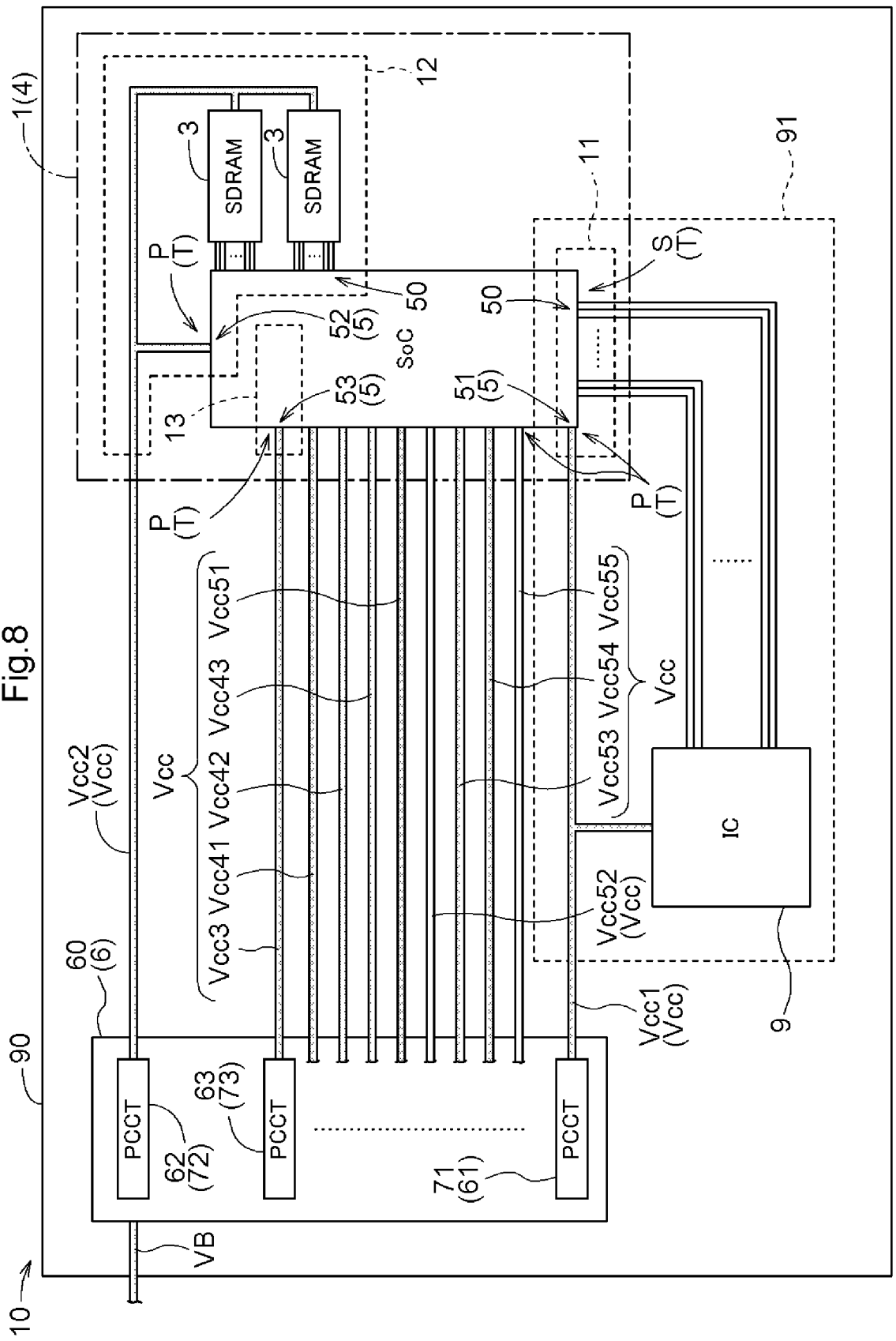

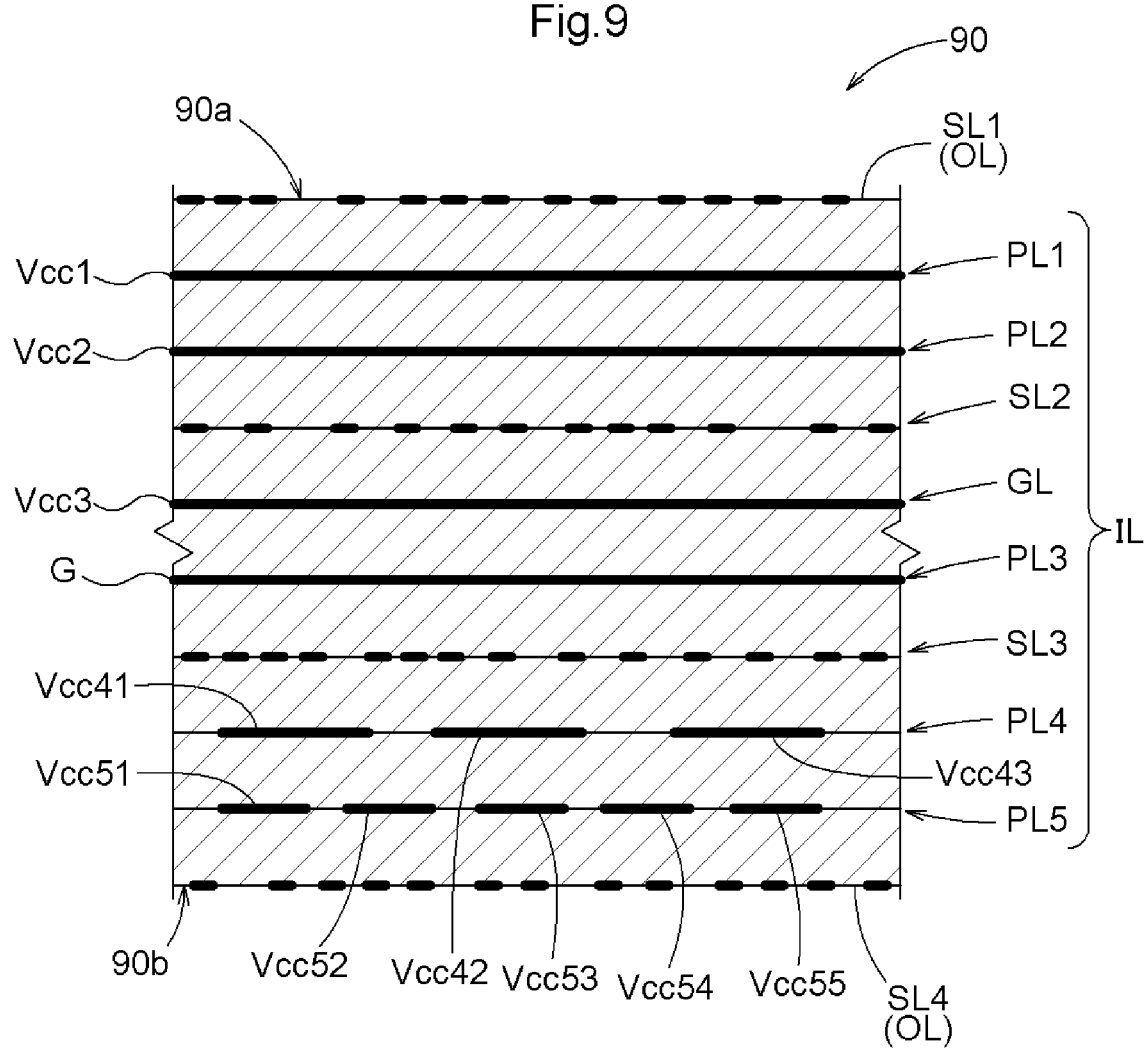

SEMICONDUCTOR DEVICE

CROSS REFERENCE TO RELATED APPLICATIONS

This application is a National Stage of International Application No. PCT/JP2019/035863 filed Sep. 12, 2019, claiming priority based on Japanese Patent Application No. 2019-038618 filed Mar. 4, 2019, the contents of which are incorporated by reference in their entirety.

TECHNICAL FIELD

The present disclosure relates to a semiconductor device provided with a main substrate and a semiconductor module.

BACKGROUND ART

Semiconductor modules that are based on SoC (System on a Chip), SiP (System in a Package), or the like are generally structured to have a plurality of functional blocks. A semiconductor module disclosed in International Application Publication No. WO 2017/038905 (WO 2017/038905) has functional blocks (refer to, for example, FIG. 7) such as a plurality of CPU cores, a DSP (Digital Signal Processor), and an interface with a SDRAM (Synchronous Dynamic Random Access Memory). Since each functional block often operates on a different power supply voltage or the like, some of such semiconductor modules need a plurality of power supplies. For example, a CPU core and a DSP operate on a power supply voltage of 1.0 [V], a SDRAM operates on a power supply voltage of 1.5 [V], and an I/O terminal that is connected to a peripheral circuit operates on a power supply voltage of 3.3 [V] or 1.8 [V]. Further, in some cases, even when a plurality of CPU cores or DSPs that operate on the same power supply voltage are included, separate power supplies may be provided therefor. That is, it is common for a semiconductor module to operate with supplies of a plurality of types of electric power.

Although the above publication illustrates that the semiconductor module is supplied with two or three types of electric power, there are some instances where a semiconductor module is supplied with four or more types of electric power. Typically, a power supply for supplying many types of electric power is formed by a power supply circuit on a main substrate on which the semiconductor module is mounted. Wiring for transmitting electric power on a substrate is required to have a large wiring width in order to keep the impedance low by increasing the cross-sectional area. For this reason, in particular, electric power having high current consumption may be transmitted by using the whole of one wiring layer (in many cases, an internal wiring layer).

RELATED ART DOCUMENTS

Patent Documents

Patent Document 1: WO 2017/038905

SUMMARY OF THE DISCLOSURE

Problem to be Solved by Various Aspects of the Disclosure

In recent years, more functional blocks are mounted on a semiconductor module due to an increase in integration density, among others, and there is a trend that more types of electric power are supplied to a semiconductor module. As described above, when the number of types of electric power required to be transmitted by using the whole of one internal wiring layer in a main substrate on which a semiconductor module is mounted increases, the number of wiring layers that structure the main substrate increases, and the cost of the main substrate increases accordingly.

In view of the above background, there is a need to supply electric power to a semiconductor module appropriately and also to curb the number of wiring layers of a main substrate on which a semiconductor module is mounted.

Means for Solving the Problem

In view of the above, a semiconductor device according to an aspect is a semiconductor device provided with a main substrate and a semiconductor module, wherein a first power supply circuit, the semiconductor module, and a first element are mounted on the main substrate; the semiconductor module is provided with a second element and a module substrate on which the second element is mounted; the first power supply circuit supplies electric power to the first element; the semiconductor module is further provided with a second power supply circuit mounted on the module substrate, and the second power supply circuit supplies electric power to the second element.

In a semiconductor device like this, in most cases, a power supply circuit is formed on a main substrate, and electric power is supplied from the power supply circuit to a first element mounted on the main substrate and to a second element mounted on a module substrate of a semiconductor module. For example, when the electric power supplied to the first element and the electric power supplied to the second element are different from each other, there is a possibility that wiring for the electric power that is not used in the main substrate may be formed in the main substrate. In general, a wire for transmitting electric power (Vcc) is very thick compared with a wire for transmitting signals and is often formed as a power supply plane that uses the whole of one wiring layer. For example, if such a power supply plane is formed in the main substrate in order to transmit, to the second element, the electric power that is not used in the main substrate, the cost of the semiconductor device may increase. According to the present structure, since the electric power to be used by the second element mounted on the module substrate is generated by the second power supply circuit mounted on the module substrate, it is not necessary to transmit electric power from the main substrate to the semiconductor module. This eliminates the need to provide the main substrate with a power supply plane used to transmit the electric power to the second element, thus allowing reductions in the costs of the main substrate and the semiconductor device. That is, according to the present structure, it is possible to supply electric power to a semiconductor module appropriately and also to curb the number of wiring layers of a main substrate on which the semiconductor module is mounted.

In view of the above, a semiconductor device according to another aspect is a semiconductor device provided with a main substrate and a semiconductor module, wherein a first power supply circuit and the semiconductor module are mounted on the main substrate; the semiconductor module is provided with a processor, a memory that works in conjunction with the processor, and a module substrate on which the processor and the memory are mounted; the processor is provided with a power input portion having a plurality of systems; a first circuit including a first-system power input portion, and a second circuit including a second-system power input portion and the memory, are formed in the semiconductor module, the first-system power input portion being the power input portion of at least one of the plurality of systems of the processor, the second-system power input portion being the power input portion of at least another one of the plurality of systems of the processor; the first power supply circuit supplies a first electric power to the first circuit; the semiconductor module is further provided with a second power supply circuit mounted on the module substrate, and the second power supply circuit supplies the second circuit with a second electric power that is different from the first electric power.

When the memory that is accessed by the processor to exchange data with the processor is a circuit block completed on the module substrate, the second electric power is not necessary on the main substrate. Generating the second electric power by the second power supply circuit mounted on the module substrate like in the present structure eliminates the need to form a circuit related to the second electric power. Wiring for transmitting electric power on the main substrate is required to have a large width in order to keep the impedance low, and therefore the electric power is often transmitted by using the whole of one internal wiring layer. The present structure eliminates the need to provide an internal wiring layer for the second electric power in the main substrate, thus allowing a reduction of internal wiring layers of the main substrate. Therefore, for example, by utilizing the internal wiring layer to be used to transmit the second electric power as a signal wiring layer, it is possible to lower the signal wiring density so as to reduce crosstalk noise, and also it is possible to increase the wiring width so that the impedance is lowered to reduce signal attenuation. Further, the reduction of internal wiring layers may lower the substrate cost. In this way, according to the present structure, it is possible to supply electric power to a semiconductor module appropriately and also to curb the number of wiring layers of a main substrate on which the semiconductor module is mounted. In particular, it is possible to appropriately supply electric power to a semiconductor module that needs to be supplied with a plurality of types of electric power and also to curb the number of internal wiring layers of a main substrate on which the semiconductor module is mounted.

Other features and advantages of the semiconductor device will be better understood by referring to the following description of embodiments in conjunction with the drawings.

BRIEF DESCRIPTION OF THE DRAWINGS

FIG. 8 is a schematic circuit block diagram illustrating a comparative example of the semiconductor device.

FIG. 9 is a cross-sectional view illustrating one example (comparative example) of the structure of a main substrate of the semiconductor device illustrated in FIG. 7.

MODES FOR CARRYING OUT THE VARIOUS ASPECTS OF THE DISCLOSURE

An embodiment of a semiconductor device is described below based on the drawings. Although the present embodiment illustrates by example that the semiconductor device is mounted, for example, on a vehicle and is structured as an ECU (Electronic Control Unit) for controlling vehicle-mounted information devices, the uses of the semiconductor device are obviously not limited to this.

Figure 1:
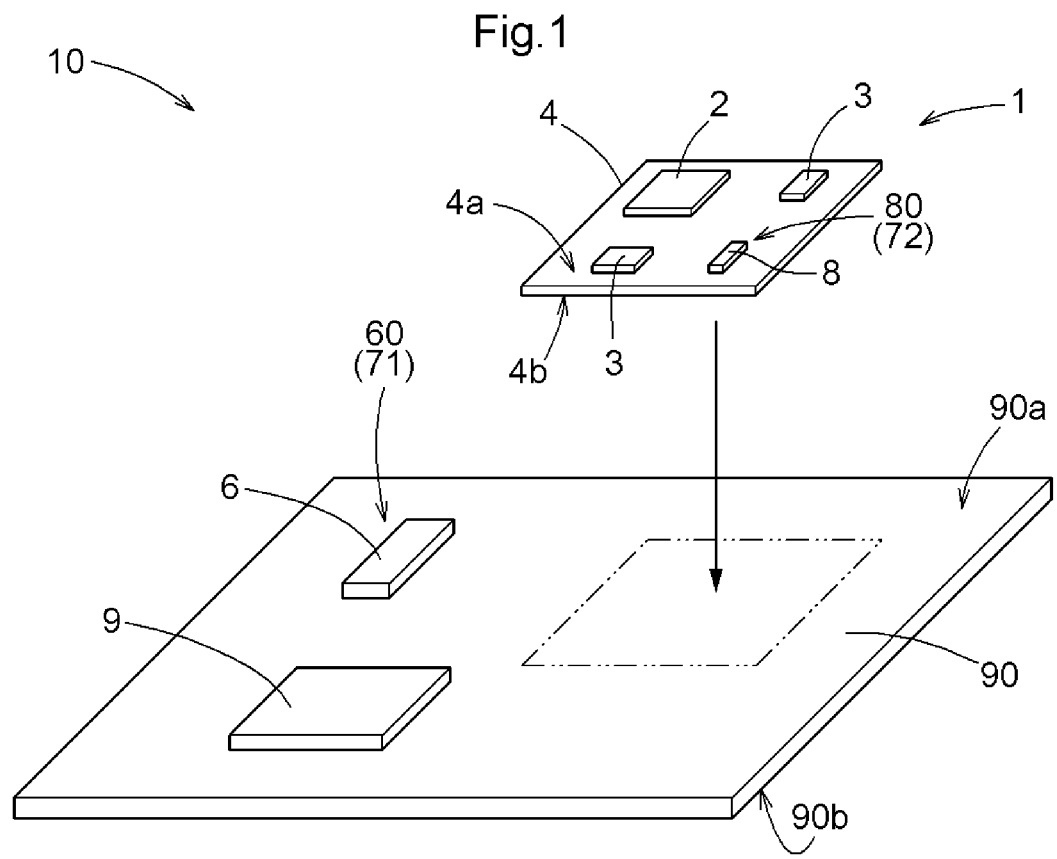
FIG. 1 is a schematic perspective exploded view of a semiconductor device.
Figure 2:
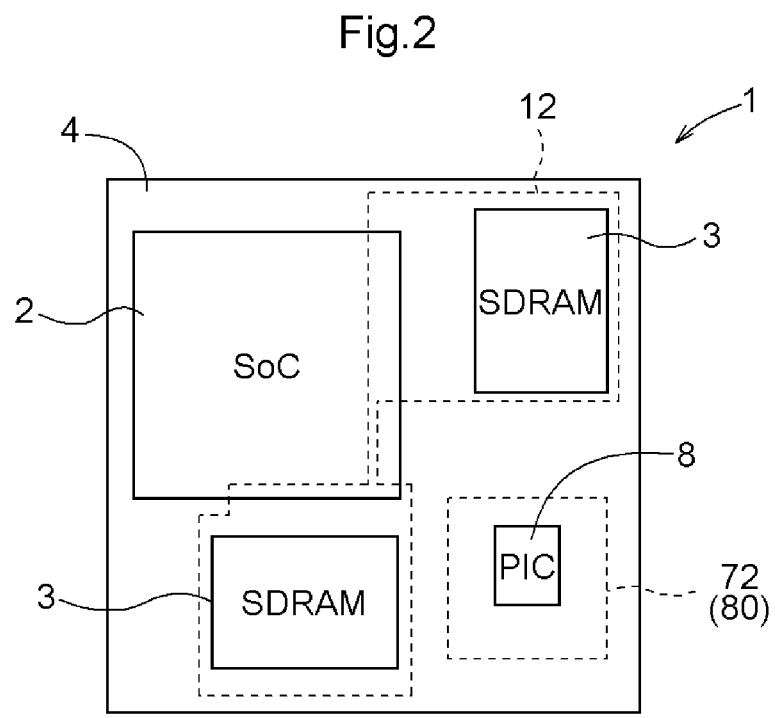
FIG. 2 is a diagram illustrating the arrangement of components of a semiconductor module.

As illustrated in the schematic perspective exploded view of FIG. 1, a semiconductor device 10 is structured to be provided with a main substrate 90 and a semiconductor module 1. A first power supply circuit 71, the semiconductor module 1, and a first element 9 are mounted on the main substrate 90. The semiconductor module 1 herein is a multi-chip module provided with a system LSI 2 (a processor, a second element), memories 3 (a second element) that work in conjunction with the system LSI 2, a second power supply circuit 72 that is described later, and a module substrate 4 on which the system LSI 2 and the memories 3 are mounted. According to the present embodiment, as illustrated in FIG. 1 and FIG. 2, the following are mounted as a second element on a module-substrate first surface 4*a*: a SoC (System on a Chip) as the system LSI 2, and two SDRAMs (Synchronous Dynamic Random Access Memory) as the memories 3. Preferably, the SDRAM may be, for example, a DDR3 (Double Data Rate3) SDRAM, a DDR4 (Double Data Rate4) SDRAM, or the like.

Although a SoC is illustrated as an example of the system LSI 2, a SiP (System in a Package) may be used. The SoC includes an ASIC (Application Specific Integrated Circuit) that is a semi-custom LSI, an ASSP (Application Specific Standard Processor) that is a general-purpose LSI, and the like. The ASIC includes not only a gate array or a cell-based IC (a standard cell), but also a PLD (Programmable Logic Device) such as a FPGA (Field Programmable Gate Array) and a PLA (Programmable Logic Array). Although the SDRAM is illustrated herein as an example of the memory 3, this does not eliminate the possibility that the memory 3 may be a memory with other structure, such as a flash memory or a SRAM (Static RAM).

Figure 5:
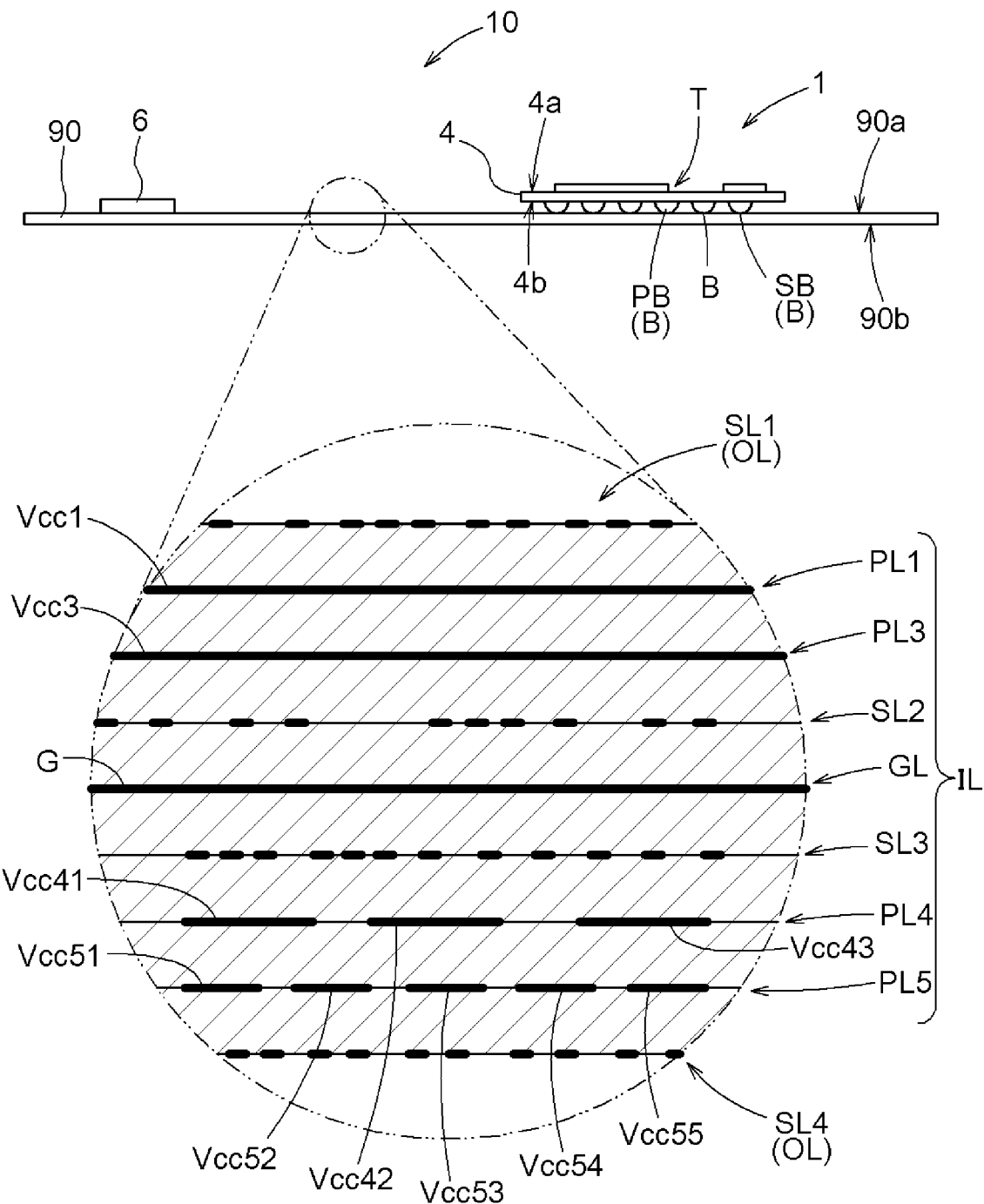
FIG. 5 is a side view illustrating one example of the semiconductor device and is a cross-sectional view illustrating one example of the structure of a main substrate.

As illustrated in FIG. 5, the semiconductor module 1 has module terminals B that are formed on a module-substrate second surface 4*b*. Soldering the module terminals B to lands that are formed on the main substrate 90 and that are not illustrated in the drawings causes the semiconductor module 1 as a multi-chip module to be mounted on the main substrate 90, like a single element. That is, the module substrate 4 and the main substrate 90 are connected to each other by mounting, as a component on the main substrate 90, the semiconductor module 1 in which the module terminals B are formed on the module substrate 4, not by simply connecting the substrates to each other with harnesses, connectors, etc.

The module terminals B are connected to the system LSI 2, among others, mounted on the module substrate 4. Signal terminals of the memory 3 that works in conjunction with the system LSI 2 are connected only to the system LSI 2. For this reason, in the semiconductor module 1 provided with the system LSI 2 and the memory 3, the module terminals B are provided for connection terminals of the system LSI 2 and connection terminals of the memory 3 except connection terminals that are used only to connect therebetween. Thus, mounting the semiconductor module 1 on the main substrate 90 improves wiring efficiency and mounting efficiency compared to when mounting the system LSI 2 and the memory 3 individually on the main substrate 90.

Figure 3:
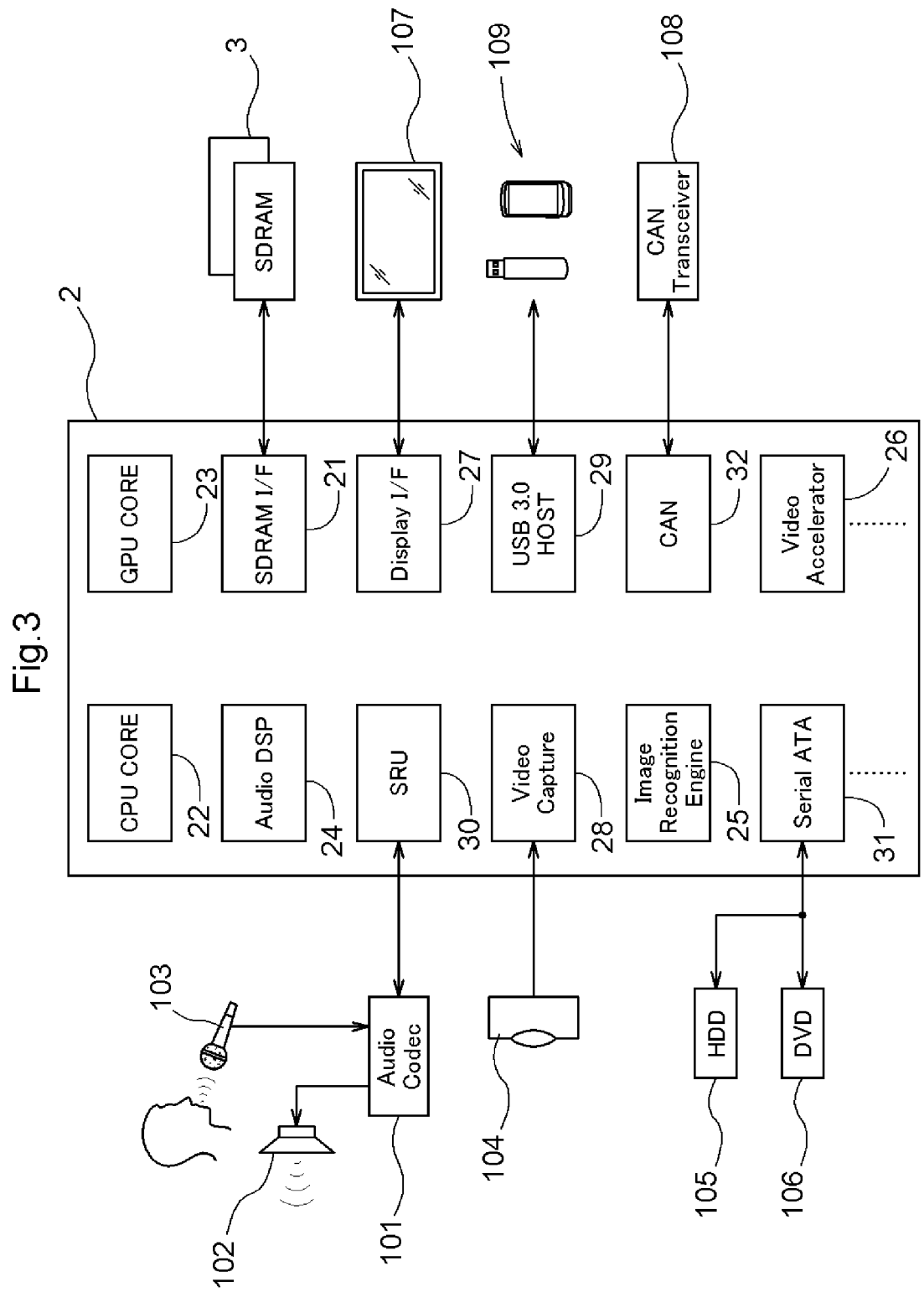
FIG. 3 is a schematic block diagram illustrating one example of a system LSI.

The schematic block diagram of FIG. 3 illustrates one example of the system LSI 2. As illustrated in FIG. 3, the system LSI 2 has functional blocks such as a CPU core (CPU CORE) 22, a GPU core (GPU CORE) 23, an audio DSP (Audio DSP), a memory interface (SDRAM I/F) 21, a sound routing unit (SRU) 30, a display interface (Display I/F) 27, a video capture (Video Capture) 28, a USB host (USB 3.0 HOST) 29, an image recognition engine (Image Recognition Engine) 25, a CAN (Control Area Network) 32, a serial ATA (Serial ATA) 31, and a video accelerator (Video Accelerator) 26.

The CPU core 22 is a computing unit including a CPU (Central Processing Unit) that serves as the core of the system LSI 2. The GPU core 23 is a computing unit including a GPU (Graphic Processing Unit) that serves as the core for computing processing mainly related to images. The memory interface 21 is a functional block that serves as an interface when the system LSI 2 writes data into the SDRAM as the memory 3, reads data from the SDRAM, and refreshes data stored in the SDRAM.

The audio DSP 24 is a DSP (Digital Signal Processor) that decodes audio data that is compressed and archived in various formats. The sound routing unit 30 is a computing unit that produces acoustic effects, such as surround play, with a speaker 102 via an audio codec device (Audio Codec) 101 or the like, and that receives audio information, such as voice input to a microphone 103, via the audio codec device 101.

The video capture 28 is a computing unit that obtains images captured by, for example, a vehicle-mounted camera 104. The image recognition engine 25 is a computing unit including an ISP (Image Signal Processor) that performs image recognition based on the images that are captured by the vehicle-mounted camera 104 and obtained by the video capture 28. The video accelerator 26 is a computing unit including an ISP that performs processing to decode video data that is compressed and archived in various formats. The display interface 27 is a computing unit that outputs, for example, in accordance with display modes of an in-vehicle display 107, images captured by the vehicle-mounted camera 104 and obtained by the video capture 28, or images decoded by the video accelerator 26. The images captured by the vehicle-mounted camera 104 may be overlaid with various information (characters, symbols, etc.) and also may be partially highlighted, based on the recognition result from the image recognition engine 25.

The USB host 29 is a computing unit that serves as an interface to enable connection with various types of USB supported devices 109 carried by users, such as portable audio devices, smartphones, and digital cameras. The serial ATA 31 is a computing unit that serves as an interface with a hard disk drive (HDD) 105 and a DVD disk drive (DVD) 106. The CAN 32 is a computing unit that serves as an interface for in-vehicle communication through an in-vehicle CAN transceiver (CAN Transceiver) 108.

The CPU core 22, the GPU core 23, the DSP, the ISP, among others, described above work in conjunction with the memory 3 when performing their respective computing processing. The semiconductor module 1 is structured as a multi-chip module that is provided with the system LSI 2, the memory 3 that works in conjunction with system LSI, and the module substrate 4 on which these are mounted. As illustrated in FIG. 1 and FIG. 5, the system LSI 2, a first memory 3*a*, a second memory 3*b*, and components including a module power supply IC 8 described later are mounted on the module-substrate first surface 4*a* that is a substrate surface on one side of the module substrate 4, and the module terminals B that are hemispherical in shape are arranged in a grip pattern on the module-substrate second surface 4*b* that is a substrate surface on the other side of the module substrate 4, thereby structuring the semiconductor module 1. The module terminals B include module signal input-output terminals SB for transmitting module signals, and module power terminals PB through which electric powers Vcc are transmitted. It is noted that the "signal input-output terminals" include "input terminals", "output terminals", and "bidirectional terminals".

Chip terminals T of the system LSI 2 are arranged around the perimeter of a package when the system LSI 2 is of a QFP (Quad Flat Gull Wing Leaded Package) type, and are arranged on the bottom (a surface that faces the module-substrate first surface 4*a*) of the package when the system LSI 2 is of a BGA (Ball Grid Array) type. As illustrated in the circuit block diagram of FIG. 4, the chip terminals T include chip signal input-output terminals S and chip power terminals P. Among the chip signal input-output terminals S, terminals that are configured to be connected to circuitry formed in the main substrate 90 (for example, the first element 9 (a connection target element) (refer to FIG. 4)) are connected to the module signal input-output terminals SB (refer to FIG. 5) within the module substrate 4. Among the chip signal input-output terminals S, terminals that are connected only to circuitry on the module substrate 4 are not connected to any of the module signal input-output terminals SB. Among the chip power terminals P, terminals that are configured to be connected to power circuits formed in the main substrate 90 (for example, the first power supply circuit 71 described later) are connected to the module power terminals PB (refer to FIG. 5) within the module substrate 4. Among the chip power terminals P, terminals that are connected to power circuits on the module substrate 4 (for example, the second power supply circuit 72) and that are not connected to the main substrate 90 are not connected to any of the module power terminals PB.

Incidentally, a plurality of functional blocks such as those described above are structured in the system LSI 2, and the semiconductor module 1 as a multi-chip module also has a plurality of functional blocks. In the system LSI 2, such as SoC and SiP, where a plurality of functional blocks are integrated, the plurality of functional blocks operate with supplies of electric powers corresponding to their individual electrical properties. The "electric power" as used herein includes "voltage" and "current" and is ideally supplied from a "power supply (power supply circuit)" capable of producing, at a stable "voltage", "current" that does not fluctuate greatly under load.

For example, the CPU core 22, the GPU core 23, the DSP, and the ISP operate on a power supply of a rated voltage of 1.0 [V], whereas the memory 3, the memory interface 21, and the chip terminals T (chip signal input-output terminals S) of the system LSI 2 that are connected to the memory 3 operate on a power supply of a rated voltage of 1.5 [V] or 1.35 [V]. The chip signal input-output terminals S of the system LSI 2 that are configured to be connected to peripheral circuitry are connected, for example, to I/O pads (signal input-output portions 50) within the system LSI 2, and rated voltages of electric power supplied to the I/O pads include 3.3 [V] and 1.8 [V].

Thus, there is a need to supply a plurality of electric powers to the system LSI 2. Further, considering the load on a power supply circuit, even if functional blocks have the same rated voltage, the functional blocks preferably be supplied with separate powers when the total power consumption is high. Furthermore, even if functional blocks have the same rated voltage, the functional blocks may preferably operate on a plurality of separate powers in order to reduce the likelihood that power supply noise caused by the operation of one functional block will affect another functional block. For these reasons, as illustrated in FIG. 4, the system LSI 2 is provided with a power input portion 5 having a plurality of systems and is supplied with a plurality of electric powers Vcc.

Figure 4:
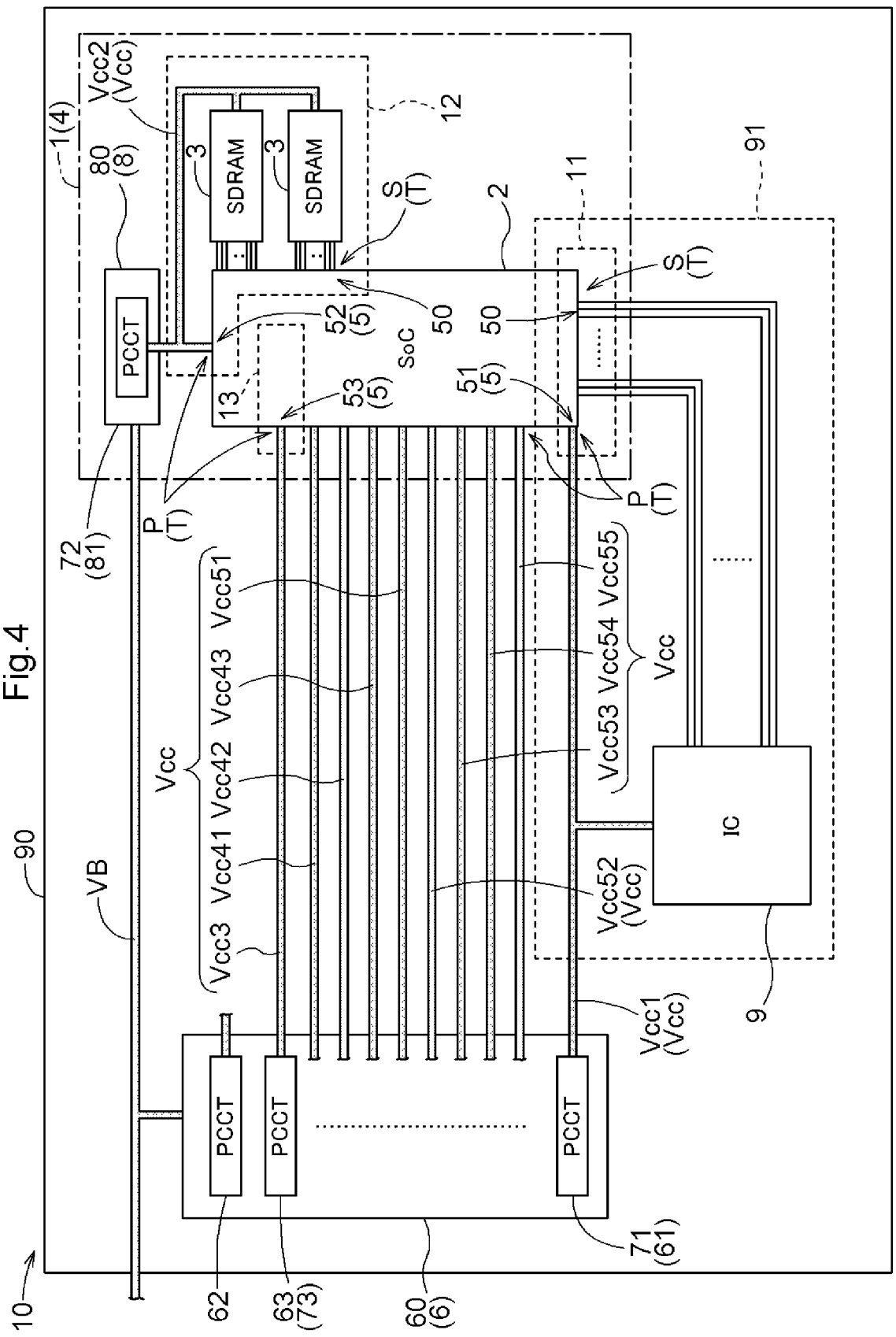
FIG. 4 is a schematic circuit block diagram illustrating one example of the semiconductor device.

As illustrated in FIG. 4, according to the present embodiment, the system LSI 2 is supplied with 11 types of electric powers Vcc (a first electric power Vcc1, a second electric power Vcc2, . . . ). For example, the first electric power Vcc1 (a first system power) is the electric power Vcc that is supplied to the CPU core 22, the second electric power Vcc2 (a second system power) is the electric power Vcc that is supplied to the memory 3 and the memory interface 21, and a third electric power Vcc3 (a third system power) is the electric power Vcc that is supplied to the GPU core 23. Fourth system powers are of three types; a fourth-system first electric power Vcc41, a fourth-system second electric power Vcc42, and a fourth-system third electric power Vcc43 are the electric powers Vcc that are supplied to the DSP, the ISP, among others (reference characters 24 to 26, among others). Fifth system powers are of five types; a fifth-system first electric power Vcc51, a fifth-system second electric power Vcc52, a fifth-system third electric power Vcc53, a fifth-system fourth electric power Vcc54, and a fifth-system fifth electric power Vcc55 are the electric powers Vcc that are supplied to the I/O pads (the signal input-output portions 50), the various interface units, among others (reference characters 27 to 32, among others).

As illustrated in FIG. 4, a first circuit 11 and a second circuit 12 are formed in the semiconductor module 1. The first circuit 11 includes a first-system power input portion 51 that is the power input portion 5 of at least one of the systems of the system LSI 2. The second circuit 12 includes the memory 3 and a second-system power input portion 52 that is the power input portion 5 of at least another one of the systems of the system LSI 2. The first power supply circuit 71 generates the first electric power Vcc1 and is mounted on the main substrate 90 on which the semiconductor module 1 is mounted. The first power supply circuit 71 supplies the first electric power Vcc1 to the first circuit 11. More specifically, the first power supply circuit 71 supplies the first electric power Vcc1 to the first circuit 11 of the semiconductor module 1 via the module power terminals PB that are one type of the module terminals B illustrated in FIG. 5. In addition to the system LSI 2 and the memory 3, the semiconductor module 1 is further provided with the second power supply circuit 72 mounted on the module substrate 4. The second power supply circuit 72 supplies the second circuit 12 with the second electric power Vcc2 that is different from the first electric power Vcc1. It is noted that the first circuit 11 also includes circuitry, a power input pad, and the like that operate on the first electric power Vcc1 inside the system LSI 2 (in semiconductor cells). The same is true for the second circuit 12 and a third circuit 13 that is described later.

On the main substrate 90, a main power supply circuit 60 including the first power supply circuit 71 is structured based on a main power supply IC 6. The main power supply IC 6 is structured to have power supply functional blocks capable of generating plurality of types of electric power, and power supply circuit blocks (PCCT) including passive components, such as smoothing capacitors, bypass capacitors, and resistors which are not illustrated, are formed based on the respective power supply functional blocks. The first power supply circuit 71 is structured with a first main-power-supply circuit block 61 that includes one of the power supply functional blocks of the main power supply IC 6. Further, for example, a third power supply circuit 73 is structured with a third main-power-supply circuit block 63 that includes another one of the power supply functional blocks of the main power supply IC 6. Although illustrated in a simplified manner in FIG. 4, the fourth system powers of three types (Vcc41 to Vcc43) and the fifth system powers of five types (Vcc51 to Vcc55) are structured with corresponding main-power-supply circuit blocks that each includes one of the power supply functional blocks of the main power supply IC 6. The main power supply circuit 60 generates each of the electric powers Vcc from a base electric power VB supplied from outside the semiconductor device 10, for example, from a vehicle-mounted direct current power source (a main power source for low voltage: e.g., a rated voltage of 12 [V]) that is not illustrated.

It is noted that the second power supply circuit 72 also can be structured to include one of the power supply functional blocks of the main power supply IC 6. For example, as illustrated in FIG. 8 that is a block diagram of a comparative example of the present embodiment, the second power supply circuit 72 also can be structured with a second main-power-supply circuit block 62 that includes one of the power supply functional blocks of the main power supply IC 6. However, according to the present embodiment, the second power supply circuit 72 is mounted on the module substrate 4. On the module substrate 4, a module power supply circuit 80 including the second power supply circuit 72 is structured based on the module power supply IC 8. Like the main power supply IC 6, the module power supply IC 8 is structured to include at least one power supply functional block capable of generating electric power, and one power supply circuit block (PCCT) is formed based on one power supply functional block. The second power supply circuit 72 is structured with a first module power supply circuit block 81 that includes one power supply functional block of the module power supply IC 8. The module power supply circuit 80 (the second power supply circuit 72) also generates the second electric power Vcc2 from the base electric power VB.

As illustrated in FIG. 4, the second circuit 12 is a circuit that is completed within the module substrate 4. Thus, when the second electric power Vcc2 is generated at the module substrate 4, the main substrate 90 does not need the second electric power Vcc2. Wiring for transmitting electric power on the main substrate 90 is required to have a large width in order to keep the impedance low. However, providing such electric power transmission wiring at surface wiring layers (a reference sign "OL" in FIG. 5) is not preferable because this limits areas for mounting components and areas for providing signal wiring. For this reason, such electric power transmission wiring is provided using internal wiring layers (a reference sign "IL" in FIG. 5). In many cases, such electric power transmission wiring is provided using the whole of one internal wiring layer.

FIG. 5 schematically illustrates a cross-section of the main substrate 90. At least nine wiring layers (although the number of layers may be an even number greater than or equal to ten as described later, the example here illustrates nine layers of them) are formed in the main substrate 90 in order from a main-substrate first surface 90a where the semiconductor module 1 is mounted to a main-substrate second surface 90b on the back side. The wiring layers are formed in the following order, staring on the main-substrate first surface 90a side: a first signal wiring layer SL1, a first power wiring layer PL1, a third power wiring layer PL3, a second signal wiring layer SL2, a ground wiring layer GL, a third signal wiring layer SL3, a fourth power wiring layer PL4, a fifth power wiring layer PL5, and a fourth signal wiring layer SL4. The first signal wiring layer SL1, the second signal wiring layer SL2, the third signal wiring layer SL3, and the fourth signal wiring layer SL4 are wiring layers where signal wires are provided. The first signal wiring layer SL1 and the fourth signal wiring layer SL4 are surface wiring layers OL, whereas the second signal wiring layer SL2 and the third signal wiring layer SL3 are internal wiring layers IL.

The first power wiring layer PL1 is a wiring layer where the first electric power Vcc1 is transmitted. The third power wiring layer PL3 is a wiring layer where the third electric power Vcc3 is transmitted. The fourth power wiring layer PL4 is a wiring layer where the fourth system powers of three types (Vcc41 to Vcc43) are transmitted and where three different power wires are formed. The fifth power wiring layer PL5 is a wiring layer where the fifth system powers of five types (Vcc51 to Vcc55) are transmitted and where five different power wires are formed. The first power wiring layer PL1, the third power wiring layer PL3, the fourth power wiring layer PL4, and the fifth power wiring layer PL5 are internal wiring layers IL. The ground wiring layer GL is a wiring layer of a ground G that serves as a reference of the semiconductor device 10. The order of these wiring layers is one example and does not limit the structure of the semiconductor device 10. Further, this does not eliminate the possibility that a wiring layer for the base electric power VB will be provided by using all or some of the internal wiring layers IL.

It is noted that a substrate having a plurality of wiring layers (a multilayer substrate) is generally formed by stacking a plurality of double-sided substrates, each having two surface wiring layers, on top of each other. Thus, the number of the wiring layers is usually an even number. For example, when the main substrate 90 according to the present embodiment is structured with a 10-layer substrate having an even number of wiring layers, it is preferable to add one ground wiring layer GL or to add one signal wiring layer. The addition of the ground wiring layer GL stabilizes the electric powers Vcc and also causes a shielding effect that provides a shield between the signal wiring layers, thereby improving signal transmission reliability. On the other hand, by adding the signal wiring layer, it is possible to lower the signal wiring density so as to reduce crosstalk noise, and also it is possible to increase the wiring width so that the impedance is lowered to reduce signal attenuation.

FIG. 9 illustrates a cross-section of a main substrate 90 corresponding to the block diagram of the comparative example illustrated in FIG. 8. As described above, in a semiconductor module 1 according to the comparative example, a second power supply circuit 72 is also formed on the main substrate 90. For this reason, a second power wiring layer PL2 for transmitting the second electric power Vcc2 is formed in the main substrate 90, unlike in the present embodiment illustrated in FIG. 5. To suppress interference between signal wires, such as crosstalk noise, a plurality of signal wiring layers are preferably arranged so as not to be adjacent to each other, and therefore a power wiring layer or a ground wiring layer is often provided between the signal wiring layers. For this reason, the arrangement of the wiring layers differs between FIG. 5 and FIG. 8, depending on the presence or absence of the second power wiring layer PL2, but this does not intend to limit any structure of the semiconductor device 10.

As can be clearly seen by comparing FIG. 5 and FIG. 9, providing the semiconductor module 1 with the second power supply circuit 72 allows elimination of the power wiring layer (the second power wiring layer PL2) in the main substrate 90. Thus, it is possible to reduce the number of wiring layers of the main substrate 90 having a plurality of wiring layers. The comparison between FIG. 9 and FIG. 5 shows that a reduction of one layer from ten layers to nine layers is possible, and this suggests that in general the reduction effects may be limited on a substrate formed with an even number of layers. However, as described above, adding a ground wiring layer or adding a signal wiring layer allows improvement in noise resistance of the semiconductor device 10. Thus, it is possible to improve the reliability of the semiconductor device 10 and also to reduce the cost by elimination of anti-noise components. Further, when an additional wiring layer has been used to provide an even number of wiring layers, it may be possible to eliminate one signal wiring layer along with elimination of one power wiring layer. In this case, elimination of the second power wiring layer PL2 reduces the cost of the main substrate 90. Therefore, it is preferable that even just one internal power wiring layer in the main substrate 90 be eliminable.

Further, when the second power supply circuit 72 is formed in the semiconductor module 1, the second main-power-supply circuit block 62 becomes available for other uses, as can be clearly seen by comparing FIG. 4 and FIG. 8. For example, when the main power supply IC 6 does not have a sufficient number of power supply functional blocks, the electric powers Vcc may be generated on the main substrate 90 by a dropper circuit or the like that uses a linear regulator IC or the like. Such a dropper circuit has low energy efficiency because a voltage drop is consumed by heat. In this case, it is possible to improve energy efficiency by using the second main-power-supply circuit block 62.

Figure 6:
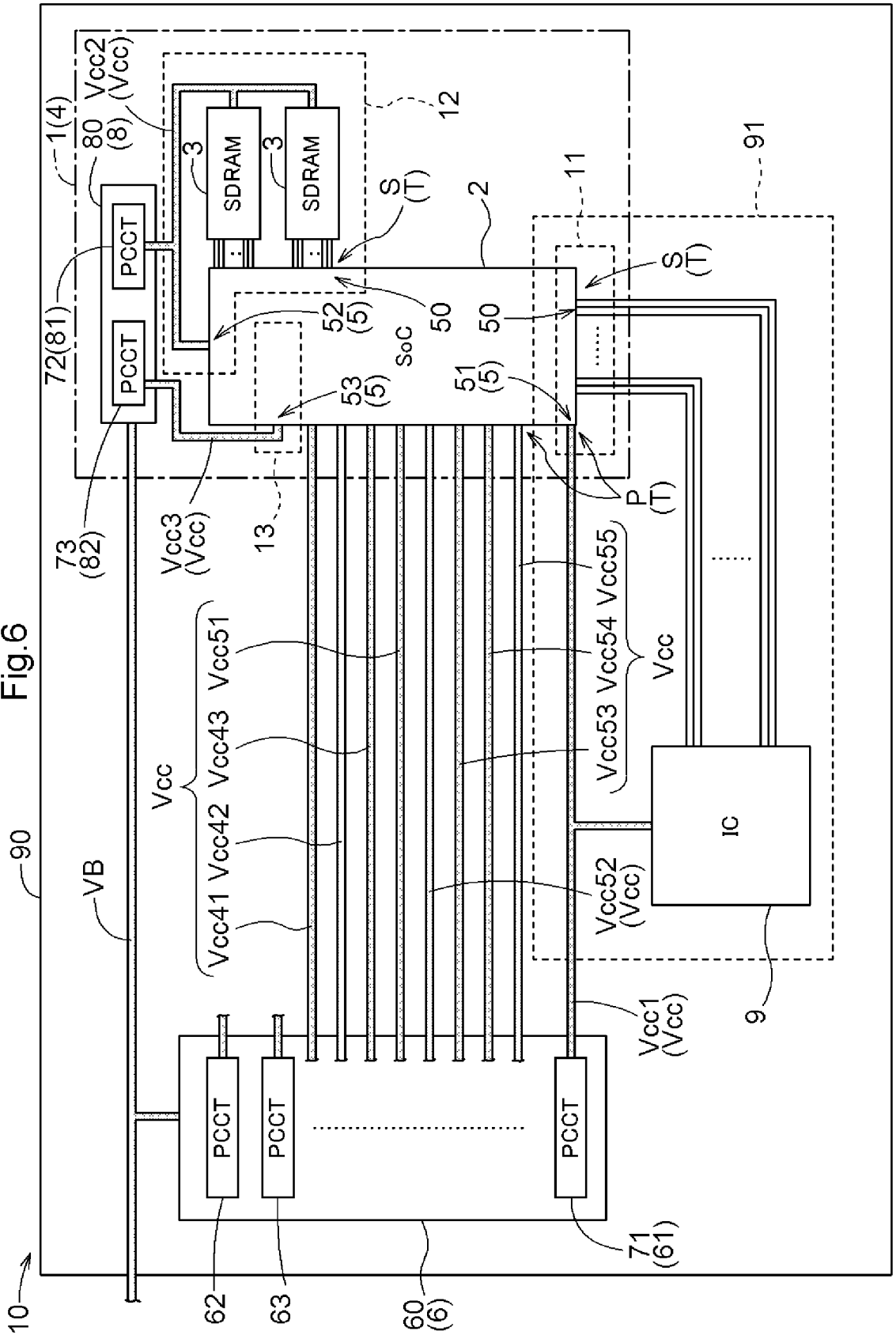
FIG. 6 is a schematic circuit block diagram illustrating another example of the semiconductor device.

Further, in another embodiment, a power supply circuit that generates a plurality of electric powers Vcc may be preferably provided on the semiconductor module 1 so that two power wiring layers are eliminable. The circuit block diagram of FIG. 6 illustrates an embodiment where the semiconductor module 1 is further provided with the third power supply circuit 73 mounted on the module substrate 4. Specifically, on the module substrate 4, the module power supply circuit 80 that includes the second power supply circuit 72 and the third power supply circuit 73 is structured based on the module power supply IC 8. The module power supply IC 8 is structured to include at least two power supply functional block capable of generating electric powers, and one power supply circuit block (PCCT) is formed based on one power supply functional block. As described above, the second power supply circuit 72 is structured with the first module power supply circuit block 81 that includes one of the power supply functional blocks of the module power supply IC 8. On the other hand, the third power supply circuit 73 is structured with a second module power supply circuit block 82 that includes another of the power supply functional blocks of the module power supply IC 8.

A third circuit 13 including a third-system power input portion 53 is further formed in the semiconductor module 1. The third-system power input portion 53 is the power input portion 5 of at least one of the systems of the system LSI 2 other than the first-system power input portion 51 and the second-system power input portion 52. The third power supply circuit 73 supplies the third circuit 13 with the third electric power Vcc3 that is different from the first electric power Vcc1 and the second electric power Vcc2.

As described above, the power wiring layers of the main substrate 90 include: layers that each transmits one type of the electric powers Vcc by using the whole of one of the internal wiring layers IL, such as the first power wiring layer PL1, the second power wiring layer PL2, and the third power wiring layer PL3; and layers that each transmits a plurality of electric powers Vcc in one of the internal wiring layers IL, such as the fourth power wiring layer PL4 and the fifth power wiring layer PL5. Generating, the electric powers Vcc that are to be transmitted through the fourth power wiring layer PL4 and the fifth power wiring layer PL5, on the semiconductor module 1 side does not lead to a reduction in the power wiring layers, because other electric powers Vcc generated on the main substrate 90 are transmitted through the fourth power wiring layer PL4 and the fifth power wiring layer PL5. In contrast, generating, the electric powers Vcc that are to be transmitted through the layers that each transmits one type of the electric powers Vcc by using the whole of one of the internal wiring layers IL, on the semiconductor module 1 side allows a reduction in the power wiring layers.

Current consumption in the electric power Vcc that is transmitted by using the whole of one of the internal wiring layers IL is higher than power consumption in the electric power Vcc that is transmitted by using part of one of the internal wiring layers IL. In other words, to reduce a voltage drop during transmission, impedance for the electric power Vcc having high current consumption needs to be lower than that for the electric power Vcc having low power consumption. For this reason, the electric power Vcc having high current consumption needs to be transmitted with a greater wiring width than the electric power Vcc having low power consumption and is often transmitted by using the whole of one of the internal wiring layers IL. Therefore, the third electric power Vcc3 may preferably be the highest in current consumption among the electric powers Vcc that are individually supplied to the plurality of systems of the power input portion 5 of the system LSI 2 and that are other than the first electric power Vcc1 and the second electric power Vcc2.

Figure 7:
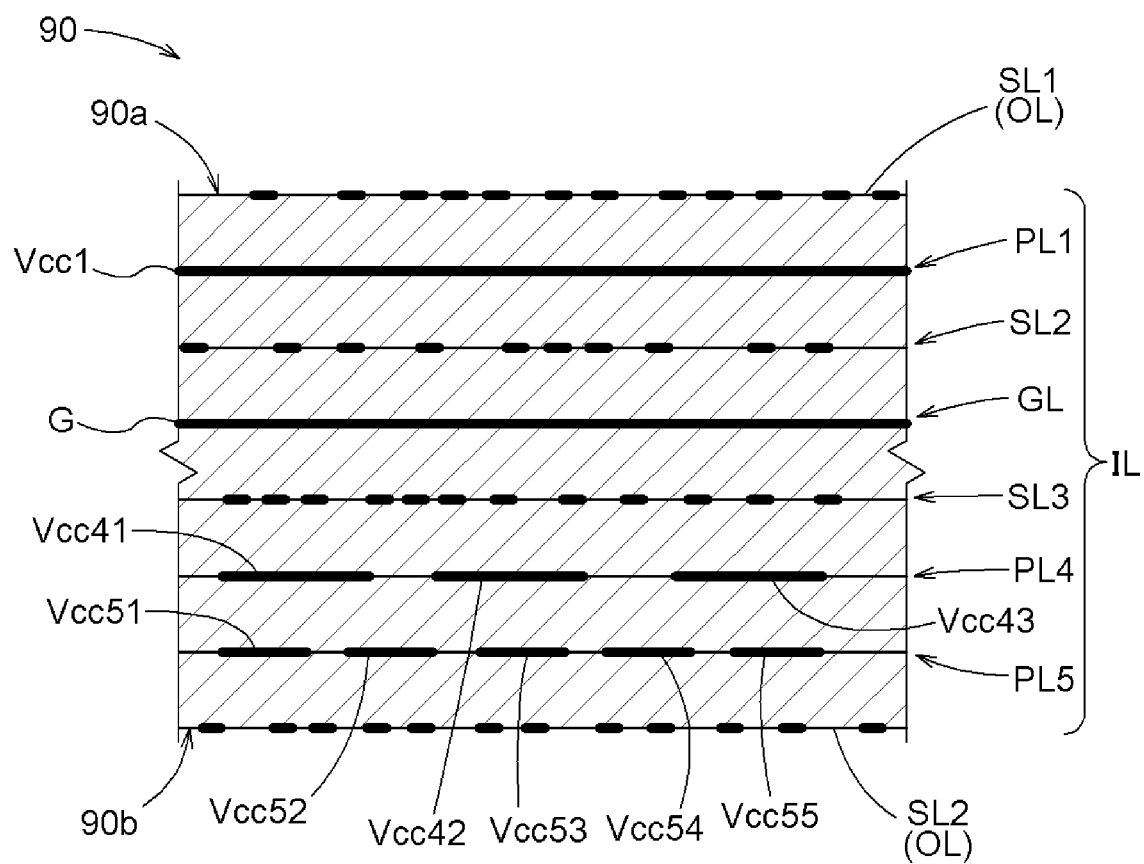
FIG. 7 is a cross-sectional view illustrating one example of the structure of a main substrate of the semiconductor device illustrated in FIG. 6.

As illustrated in FIG. 6 and FIG. 7, when the second electric power Vcc2 and the third electric power Vcc3 that are used only within the semiconductor module 1 are generated by the second power supply circuit 72 and the third power supply circuit 73 that are formed on the semiconductor module 1, it is not necessary to provide the second power wiring layer PL2 and the third power wiring layer PL3 in the main substrate 90. This allows the main substrate 90 that is structured with a ten-layer substrate in the comparative example illustrated in FIG. 9 to be structured with an eight-layer substrate as illustrated in FIG. 7, thus allowing a reduction in the cost of the main substrate 90. For example, when electric powers Vcc that are used only within the semiconductor module 1 are generated on the main substrate 90 side as in the related art, wiring layers that are provided in the main substrate 90 to transmit the electric powers Vcc are eliminable by generating the electric powers Vcc that are used only within the semiconductor module 1 on the module substrate 4 side.

Although the criteria described above for selecting the electric powers Vcc to be generated by the semiconductor module 1 is based on current consumption, the electric powers Vcc to be generated by the semiconductor module 1 may preferably be the electric powers Vcc that are not used on the main substrate 90. In other words, the electric powers Vcc to be used in the main substrate 90 (including the electric powers Vcc to be used in both the main substrate 90 and the semiconductor module 1) may preferably be generated in the main substrate 90 (generated by the first power supply circuit 71), and the electric powers Vcc to be used only in the module substrate 4 may preferably be generated in the module substrate 4 (generated by the second power supply circuit 72). For example, the first electric power Vcc1 is used not only in the first circuit 11 of the semiconductor module 1, but also in the main substrate 90. As illustrated in FIG. 4 and FIG. 6 (including FIG. 8), the first element 9 (IC) that is a circuit element to be connected to the chip signal input-output terminals S (signal terminals) of the system LSI 2 is also mounted on the main substrate 90. The first power supply circuit 71 supplies electric power to a target circuit 91 that includes the first circuit 11 and the first element 9 (a connection target element).

When not only the electric powers Vcc that are used within the semiconductor module 1, but also the first electric power Vcc1 that is needed on the main substrate 90, are generated within the semiconductor module 1, it is necessary to supply the first electric power Vcc1 also to the main substrate 90. Accordingly, the main substrate 90 needs wiring for transmitting the first electric power Vcc1. Therefore, generating the first electric power Vcc1 on the semiconductor module 1 has little effect in reducing the wiring layers of the main substrate 90. For this reason, the first electric power Vcc1 is generated by the first power supply circuit 71 formed on the main substrate 90, not by the module power supply circuit 80 on the module substrate 4, and then is supplied to the module substrate 4. That is, the electric powers Vcc to be generated at the semiconductor module 1 may preferably be selected in decreasing order of current consumption from among the electric powers Vcc that are used only within the semiconductor module 1.

Although the system LSI 2 and the memory 3 are illustrated above as examples of the second element, the second element may be other elements that are supplied with the electric powers Vcc from the second power supply circuit 72. Further, the second element needs only to be supplied with the electric power Vcc from the second power supply circuit 72 and is not prohibited from being supplied other electric powers Vcc from the first power supply circuit 71. That is, like the system LSI 2 described above, the second element may be supplied with the electric powers Vcc from both the first power supply circuit 71 and the second power supply circuit 72.

Summary of the Embodiment

Below is a brief summary of the semiconductor device (10) described so far.

A semiconductor device (10) according to an aspect is provided with a main substrate (90) and a semiconductor module (1), wherein a first power supply circuit (71), the semiconductor module (1), and a first element (9) are mounted on the main substrate (90); the semiconductor module (1) is provided with a second element (2, 3) and a module substrate (4) on which the second element (2, 3) is mounted; the first power supply circuit (71) supplies electric power (Vcc) to the first element (9); the semiconductor module (1) is further provided with a second power supply circuit (72) mounted on the module substrate (4), and the second power supply circuit (72) supplies electric power (Vcc) to the second element (2, 3).

In a semiconductor device (10) like this, in most cases, a power supply circuit is formed on a main substrate (90), and electric power (Vcc) is supplied from the power supply circuit to a first element (9) mounted on the main substrate (90) and to a second element (2, 3) mounted on a module substrate (4) of a semiconductor module (1). For example, when the electric power (Vcc) supplied to the first element (9) and the electric power (Vcc) supplied to the second element (2, 3) are different from each other, there is a possibility that wiring for the electric power (Vcc) that is not used in the main substrate (90) may be formed in the main substrate (90). In general, wiring for transmitting electric power (Vcc) is very thick compared with wiring for transmitting signals and is often formed as a power supply plane that uses the whole of one wiring layer. For example, if such a power supply plane is formed in the main substrate (90) in order to transmit, to the second element (2, 3), the electric power (Vcc) that is not used in the main substrate (90), and the cost of the semiconductor device (10) may increase. According to the present structure, since the electric power (Vcc) to be used by the second element (2, 3) mounted on the module substrate (4) is generated by the second power supply circuit (72) mounted on the module substrate (4), it is not necessary to transmit the electric power (Vcc) from the main substrate (90) to the semiconductor module (1). This eliminates the need to provide the main substrate (90) with a power supply plane that is used to transmit the electric power (Vcc) to the second element (2, 3), thus allowing reductions in the costs of the main substrate (90) and the semiconductor device (10). That is, according to the present structure, it is possible to supply electric power (Vcc) to a semiconductor module (1) appropriately and also to curb the number of wiring layers of a main substrate (90) on which the semiconductor module (1) is mounted.

It is preferable here that the second element (2, 3) include a processor (2) and a memory (3).

A processor (2) and a memory (3) often work in conjunction with each other, and there are many signal wires that are connected only between the processor (2) and the memory (3). For this reason, in the semiconductor module (1) provided with the processor (2) and the memory (3), connection terminals (B) of the semiconductor module (1) are provided for connection terminals of the processor (2) and connection terminals of the memory (3) except connection terminals that are used only to connect therebetween. Thus, mounting the semiconductor module (1) on the main substrate (90) improves wiring efficiency and mounting efficiency compared to when mounting the processor (2) and the memory (3) individually on the main substrate (90). Therefore, it is preferable that the second element include a processor (2) and that a memory (3). Further, in most cases, the electric power supplied to the memory (2) is used only by the memory (2) or only by the memory (3) and the processor (2) that works in conjunction with the memory (3). For this reason, it is preferable that the processor (2) and the memory (3) as the second element be supplied with the electric power from the second power supply circuit (72) mounted on the module substrate (4).

Further, the semiconductor device (10) may preferably be such that: the processor (2) is provided with a power input portion (5) having a plurality of systems; a first circuit (11) including a first-system power input portion (51), and a second circuit (12) including a second-system power input portion (52) and the memory (3), are formed in the semiconductor module (1), the first-system power input portion (51) being the power input portion (5) of at least one of the plurality of systems of the processor (2), the second-system power input portion (52) being the power input portion (5) of at least another one of the plurality of systems of the processor (2); the first power supply circuit (71) supplies a first electric power (Vcc1) to the first circuit (11); the semiconductor module (1) is further provided with a second power supply circuit (72) mounted on the module substrate (4), and the second power supply circuit (72) supplies the second circuit (12) with a second electric power (Vcc2) that is different from the first electric power (Vcc1).

When the memory (3) that is accessed by the processor (2) to exchange data with the processor (2) is a circuit block completed on the module substrate (4), the second electric power (Vcc2) is not necessary on the main substrate (90). Generating the second electric power (Vcc2) by the second power supply circuit (72) on the module substrate (4) like in the present structure eliminates the need to form a circuit related to the second electric power (Vcc2) in the main substrate (90). Wiring for transmitting electric power on the main substrate (90) is required to have a large width in order to keep the impedance low, and therefore electric power is often transmitted by using the whole of one internal wiring layer (IL). The present structure eliminates the need to provide an internal wiring layer (IL) for the second electric power (Vcc2) in the main substrate (90), thus allowing a reduction of internal wiring layers (IL) in the main substrate (90). Therefore, for example, by utilizing the internal wiring layer (IL) to be used to transmit the second electric power (Vcc2) as a signal wiring layer, it is possible to lower the signal wiring density so as to reduce crosstalk noise, and also it is possible to increase the wiring width so that the impedance is lowered to reduce signal attenuation. Further, the reduction of internal wiring layers (IL) may lower the substrate cost. In this way, according to the present structure, it is possible to supply electric power to a semiconductor module (1) appropriately and also to curb the number of wiring layers of a main substrate (90) on which the semiconductor module (1) is mounted. In particular, it is possible to appropriately supply electric power to a semiconductor module (1) that needs to be supplied with a plurality of types of electric power and also to curb the number of internal wiring layers (IL) of a main substrate (90) on which the semiconductor module (1) is mounted.

It is preferable here that: the semiconductor module (1) be further provided with a third power supply circuit (73) mounted on the module substrate (4); a third circuit (13) including a third-system power input portion (53) be further formed in the semiconductor module (1), the third-system power input portion (53) being the power input portion (5) of at least one of the plurality of systems of the processor (2) other than the first-system power input portion (51) and the second-system power input portion (52); and the third power supply circuit (73) supply the third circuit (13) with a third electric power (Vcc3) that is different from the first electric power (Vcc1) and the second electric power (Vcc2).

A substrate having a plurality of wiring layers (a multilayer substrate) is generally formed by stacking a plurality of double-sided substrates, each having two surface wiring layers (OL), on top of each other. Thus, the number of the wiring layers is usually an even number (for example, a four-layer substrate, a six-layer substrate, an eight-layer substrate, etc.). Since not only the second electric power (Vcc2), but also the third electric power (Vcc3), are generated on the module substrate (4), it is possible to easily eliminate two power wiring layers from the main substrate (90). That is, since two power wiring layers are simply eliminated without redesign of signal wiring or the like, it is possible to easily reduce the number of wiring layers of the main substrate (90). Thus, it is possible to reduce the cost of the main substrate (90).

Further, when the third power supply circuit (73) supplies the third electric power (Vcc3) to the third circuit (13), the third electric power (Vcc3) may preferably be electric power (Vcc) that is the highest in current consumption among the electric powers (Vcc) that are individually supplied to the plurality of systems of the power input portion (5) of the processor (2) and that are other than the first electric power (Vcc1) and the second electric power (Vcc2).

When the whole of one internal wiring layer (IL) in the main substrate (90) is used as a wiring layer for one electric power (Vcc), power consumption in the electric power (Vcc) is generally high. On the other hand, when electric power (Vcc) has low power consumption, it is sometimes possible to transmit the electric voltage (Vcc) without using the whole of the same internal wiring layer (IL). Therefore, even when such electric power (Vcc) having low power consumption is generated at the module substrate (4), other wiring is likely to remain in the internal wiring layer (IL). That is, in order to reduce the number of internal wiring layers (IL) that are used for electric power transmission on the main substrate (90), it is preferable to eliminate the electric power (Vcc) that uses the whole of one wiring layer. Therefore, electric power (Vcc) that is the highest in current consumption, except for the first electric power (Vcc1) and the second electric power (Vcc2) that already have paths to supply electric powers (Vcc), is used as the third electric power (Vcc3).

Further, it is preferable that a connection target element (9) that is a circuit element to be connected to a signal terminal (S) of the processor (2) be further mounted on the main substrate (90), and that the first power supply circuit (71) supply electric power to a target circuit (91) that includes both the first circuit (11) and the connection target element (9).

When electric power (Vcc) that is needed not only on the module substrate (4) but also on the main substrate (90) is generated on the module substrate (4), it is necessary to supply the electric power (Vcc) to the main substrate (90). For this reason, the main substrate (90) needs wiring for transmitting the electric power (Vcc). Such wiring is likely to be provided at an internal wiring layer (IL). Therefore, generating such electric power (Vcc) on the module substrate (4) is unlikely to reduce the wiring layers of the main substrate (90). When the first electric power (Vcc1) is also supplied to the target circuit (91) including the connection target element (9) that is mounted on the main substrate (90) so as to be connected to the signal terminal (S) of the processor (2), the main substrate (90) needs wiring for the first electric power (Vcc1). Therefore, the first electric power (Vcc1) may preferably be generated by the first power supply circuit (71) formed on the main substrate (90), not by a power supply circuit (80) on the module substrate (4), and then be supplied to the module substrate (4).

DESCRIPTION OF THE REFERENCE NUMERALS

1: SEMICONDUCTOR MODULE
2: SYSTEM LSI (PROCESSOR, SECOND ELEMENT)
3: MEMORY (SECOND ELEMENT)
4: MODULE SUBSTRATE
5: POWER INPUT PORTION
9: CONNECTION TARGET ELEMENT (FIRST ELEMENT)
10: SEMICONDUCTOR DEVICE
11: FIRST CIRCUIT
12: SECOND CIRCUIT
13: THIRD CIRCUIT
51: FIRST-SYSTEM POWER INPUT PORTION
52: SECOND-SYSTEM POWER INPUT PORTION
53: THIRD-SYSTEM POWER INPUT PORTION
71: FIRST POWER SUPPLY CIRCUIT
72: SECOND POWER SUPPLY CIRCUIT
73: THIRD POWER SUPPLY CIRCUIT
90: MAIN SUBSTRATE
91: TARGET CIRCUIT
S: CHIP SIGNAL INPUT-OUTPUT TERMINAL (SIGNAL TERMINAL OF PROCESSOR)
Vcc: ELECTRIC POWER
Vcc1: FIRST ELECTRIC POWER
Vcc2: SECOND ELECTRIC POWER
Vcc3: THIRD ELECTRIC POWER

The invention claimed is:

1. A semiconductor device comprising:
a main substrate; and
a semiconductor module, wherein
a first power supply circuit, the semiconductor module, and a first element are mounted on the main substrate,
the semiconductor module is provided with a second element and a module substrate on which the second element is mounted,
the first power supply circuit supplies electric power to the first element,
the semiconductor module is further provided with a second power supply circuit mounted on the module substrate, and
the second power supply circuit supplies electric power to the second element,
wherein
the second element is a processor and a memory that works in conjunction with the processor,
the processor is provided with a power input portion having a plurality of systems,
a first circuit including a first-system power input portion, and a second circuit including a second-system power input portion and the memory, are formed in the semiconductor module, the first-system power input portion being the power input portion of at least one of the plurality of systems of the processor, the second-system power input portion being the power input portion of at least another one of the plurality of systems of the processor,
the first power supply circuit supplies a first electric power to the first circuit,
the semiconductor module is further provided with a second power supply circuit mounted on the module substrate, and
the second power supply circuit supplies the second circuit with a second electric power that is different from the first electric power.

2. The semiconductor device according to claim 1, wherein
the semiconductor module is further provided with a third power supply circuit mounted on the module substrate,
a third circuit including a third-system power input portion is further formed in the semiconductor module, the third-system power input portion being the power input portion of at least one of the plurality of systems of the processor other than the first-system power input portion and the second-system power input portion, and the third power supply circuit supplies the third circuit with a third electric power that is different from the first electric power and the second electric power.

3. The semiconductor device according to claim 2, wherein the third electric power is electric power that is the highest in current consumption among electric powers that are individually supplied to the plurality of systems of the power input portion of the processor and that are other than the first electric power and the second electric power.

4. The semiconductor device according to claim 2, wherein a connection target element that is a circuit element to be connected to a signal terminal of the processor is further mounted on the main substrate, and the first power supply circuit supplies electric power to a target circuit that includes both the first circuit and the connection target element.

\* \* \* \* \*